(12) United States Patent
Jiang et al.

(10) Patent No.: US 9,660,603 B2
(45) Date of Patent: May 23, 2017

(54) SLOPED TERMINATION IN MOLYBDENUM LAYERS AND METHOD OF FABRICATING

(71) Applicant: Texas Instruments Incorporated, Dallas, TX (US)

(72) Inventors: Neng Jiang, Plano, TX (US); Elizabeth Costner Stewart, Dallas, TX (US); Nicholas S. Dellas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/682,651

(22) Filed: Apr. 9, 2015

(65) Prior Publication Data

US 2016/0300693 A1 Oct. 13, 2016

(51) Int. Cl.
*H03H 3/02* (2006.01)

(52) U.S. Cl.
CPC .......... *H03H 3/02* (2013.01); *H03H 2003/025* (2013.01)

(58) Field of Classification Search
CPC ............................ H01L 37/32082; H03H 3/02
See application file for complete search history.

(56) References Cited

U.S. PATENT DOCUMENTS

| 4,478,678 A * | 10/1984 | Watanabe ................ C23F 4/00 204/192.34 |
| 6,432,767 B2 | 8/2002 | Torii et al. |
| 2004/0229415 A1 | 11/2004 | Takehashi et al. |
| 2006/0166108 A1* | 7/2006 | Chandrachood .......... G03F 1/32 430/5 |
| 2007/0279152 A1 | 12/2007 | Kawamura |
| 2010/0231329 A1* | 9/2010 | Barber ..................... H03H 3/02 333/187 |
| 2013/0049545 A1 | 2/2013 | Zou et al. |

OTHER PUBLICATIONS

Roman Lanz, Piezoelectric Thin Films for Bulk Acoustic Wave Resonator Applications: From Processing to Microwave Filters. EPFL, Lausanne, 2004.

* cited by examiner

*Primary Examiner* — Duy Deo
(74) *Attorney, Agent, or Firm* — Jacqueline J. Garner; Charles A. Brill; Frank D. Cimino

(57) ABSTRACT

A method of fabricating a sloped termination of a molybdenum layer includes providing the molybdenum layer and applying a photo resist material to the molybdenum layer. The photo resist material is exposed under a defocus condition to generate a resist mask having an edge portion. The molybdenum layer is etched at least at the edge portion of the resist mask to result in a sloped termination of the molybdenum layer.

20 Claims, 6 Drawing Sheets

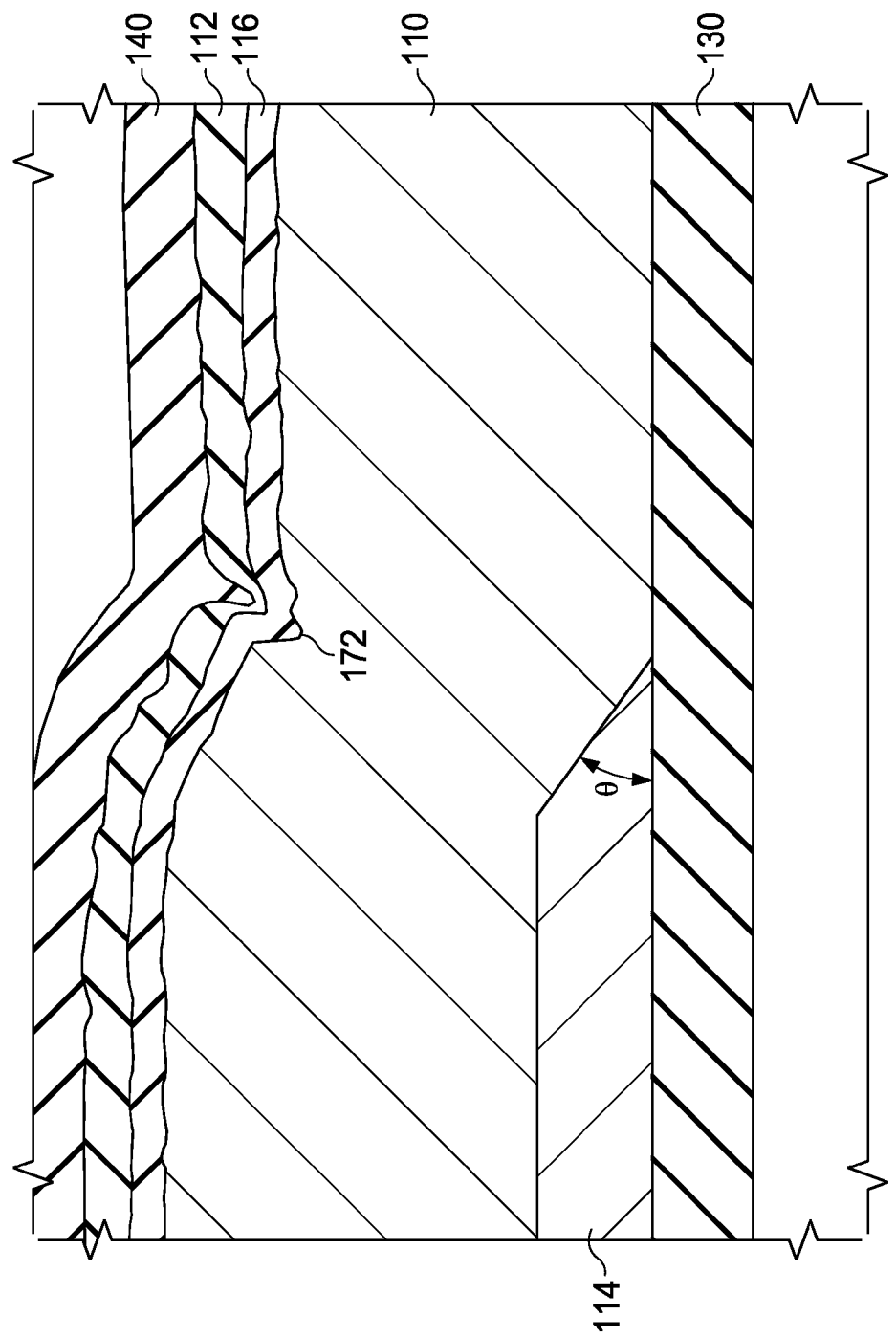

SLOPED TERMINATION IN MOLYBDENUM LAYERS AND METHOD OF FABRICATING

BACKGROUND

Some components in integrated circuits are fabricated from several layers including molybdenum (Mo), titanium tungsten (TiW), and aluminum nitride (AlN). One such device is a bulk acoustic wave (BAW) device that has a stack fabricated from layers of molybdenum, titanium tungsten, and aluminum nitride. The aluminum nitride forms an acoustic resonator with layers of molybdenum serving as electrodes across the acoustic resonator.

SUMMARY

A method of fabricating a sloped termination of a molybdenum layer includes providing the molybdenum layer and applying a photo resist material to the molybdenum layer. The photo resist material is exposed under a defocus condition to generate a resist mask having an edge portion. The molybdenum layer is etched at least at the edge portion of the resist mask to result in a sloped termination of the molybdenum layer.

BRIEF DESCRIPTION OF THE DRAWINGS

FIG. 4 is an expanded view of a seam formed proximate a molybdenum termination.

DETAILED DESCRIPTION

Components fabricated onto integrated circuits by way of stacks having a plurality of layers are described herein. These devices are susceptible to cracking and seaming at the terminations or near the terminations of molybdenum layers within the stacks. For example, applicants have discovered that devices having molybdenum as a layer or layers in a stack are susceptible to cracking or seaming where the molybdenum layers terminate at sharp angles in the stack. The sharp angles weaken the other materials in the stack and enable cracks to form, which can propagate though the stack. In some situations, the sharp angles enable seams or folds to form, which also propagate through the stack. Both the cracks and the seams can result in failure of the components in which the stacks are located. The devices and methods described herein reduce the angles at the terminations of the molybdenum layers, which reduces the possibility of cracks and seams forming in the stack.

Figure 1:
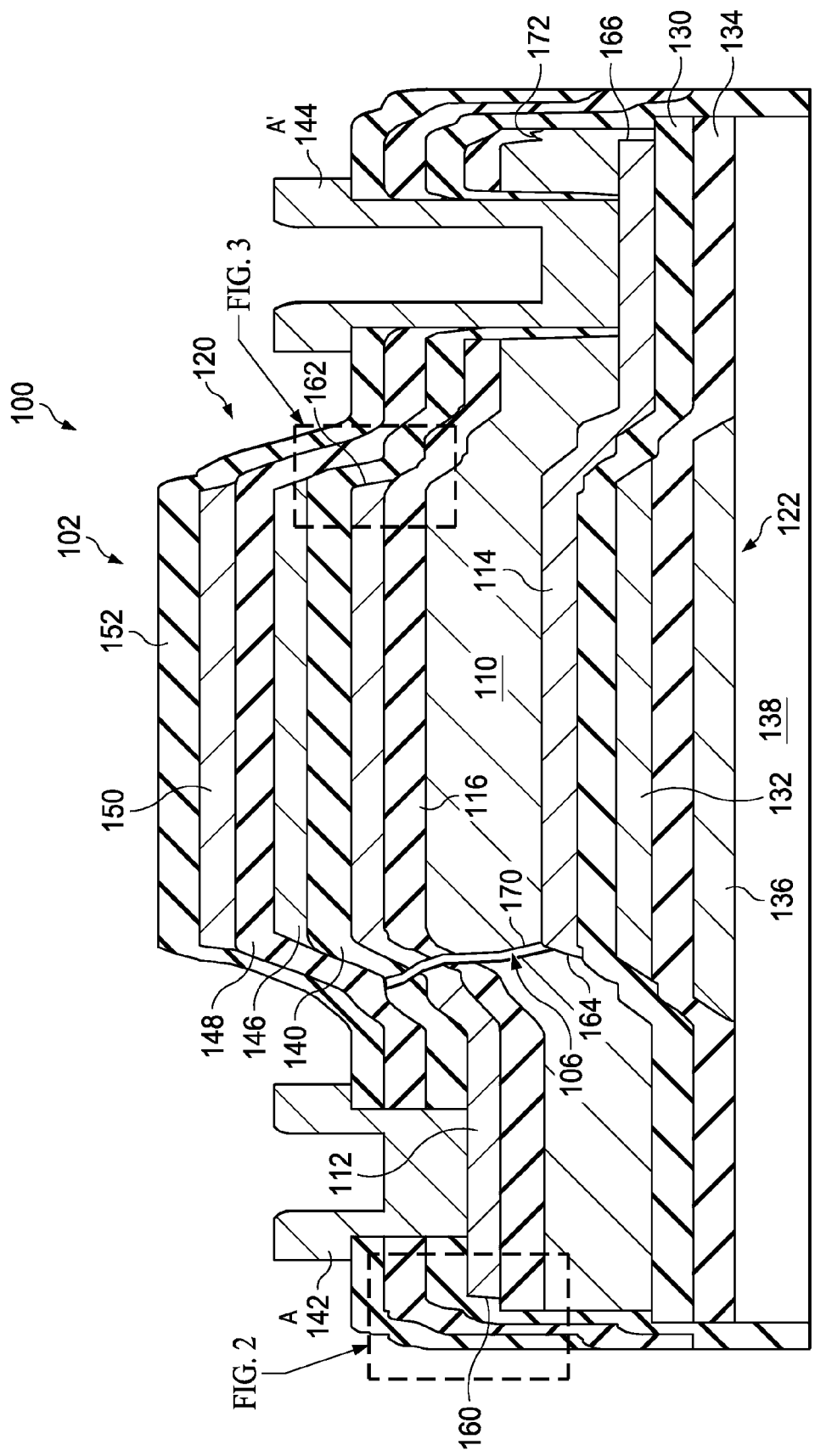
FIG. 1 is a side cutaway view of an aluminum nitride piezo based bulk acoustic wave device.

One example of a component fabricated with a stack having a plurality of layers is a bulk acoustic wave (BAW) device. FIG. 1 is an example of an aluminum nitride piezo-based (BAW) device 100 fabricated from a plurality of layers. The BAW device 100 may be part of a larger integrated circuit that is not shown. The layers form a stack 102 that results in a rise proximate the region where the BAW device 100 is located. An acoustic resonator 106 is formed within the stack 102. In the example of FIG. 1, the resonator 106 includes an aluminum nitride (AN) layer 110 sandwiched between a top electrode 112, which is formed from molybdenum and a bottom electrode 114, which is also formed from molybdenum. The top and bottom electrodes 110 and 112 are layers fabricated within the stack 102. The layers described herein are sometimes referred to as films. In the example of FIG. 1, an oxide layer 116 is located between the top electrode 112 and the AlN film 110 and serves as a temperature compensation layer for the resonator 106. In some embodiments, the BAW device 100 does not include the oxide layer 116. Sound waves bounce between the top electrode 112 and the bottom electrode 114 so as to resonate within the resonator 106.

The stack 102 includes an upper Bragg mirror 120 and a lower Bragg mirror 122. The Bragg mirrors 120 and 122 prevent energy from escaping the resonator 106 and serve to achieve other resonator specifications as are know in the art. The lower Bragg mirror 122 is formed by a plurality of alternating layers or films, which in the example of FIG. 1 are alternating layers of titanium tungsten and oxide. The lower Bragg mirror 122 of FIG. 1 has a first oxide layer 130 that is adjacent the bottom electrode 114 and extends the length of the BAW device 100. A first titanium tungsten layer 132 is located between the first oxide layer 130 and a second oxide layer 134. The second oxide layer 134, like the first oxide layer 130 extends the length of the BAW device 100. A second titanium tungsten layer 136 is located between the second oxide layer 134 and a third oxide layer 138. A substrate (not shown) is located underneath the third oxide layer 138 and is a material, such as silicon, on which the BAW device 100 is fabricated. Both the first titanium tungsten layer 132 and the second titanium tungsten layer 136 are located beneath the resonator 106 and terminate proximate the edges of the resonator 106. In some embodiments, a seed layer (not shown in FIG. 1) is located between the first oxide layer 130 and the bottom electrode 114.

The upper Bragg mirror 120 is formed from a plurality of alternating layers that are similar or identical to the layers forming the lower Bragg mirror 122. In the example of FIG. 1, the upper Bragg mirror 120 includes a first oxide layer 140 that is located adjacent the upper electrode 112 and extends the length of the BAW device 100. The BAW device 100 has two connectors 142 and 144 that are connectable to circuits that are not shown in FIG. 1. The connectors 142 and 144 are shown as cut away views and they may be relatively small. Accordingly, portions of the oxide layers in the upper Bragg mirror 120 extend around the connectors 142 and 144. A first titanium tungsten layer 146 is sandwiched between the first oxide layer 140 and a second oxide layer 148. The second oxide layer 148 extends the length of the BAW device 100. A second titanium tungsten layer 150 is sandwiched between the second oxide layer 148 and a third oxide layer 152. The third oxide layer 152 also extends the length of the BAW device 100. The first titanium tungsten layer 146 and the second titanium tungsten layer 150 terminate at the edges of the resonator 106.

Figure 3:
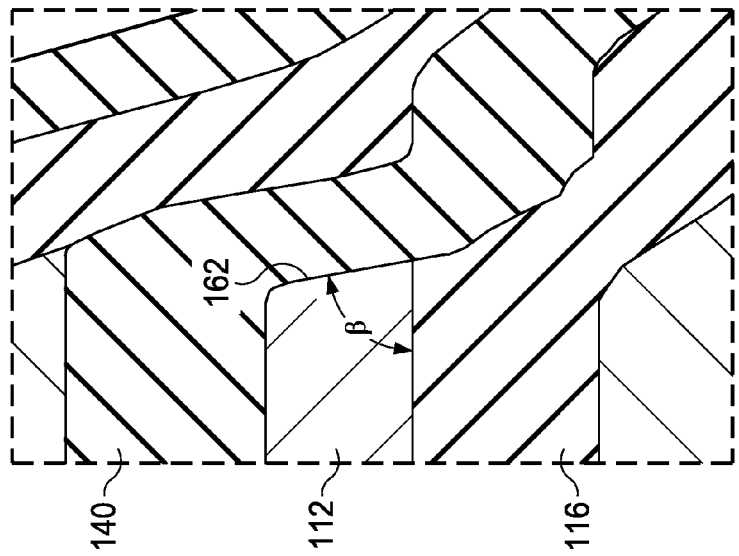
FIG. 3 is an expanded view of another molybdenum termination in the bulk acoustic wave device of FIG. 1.
Figure 2:
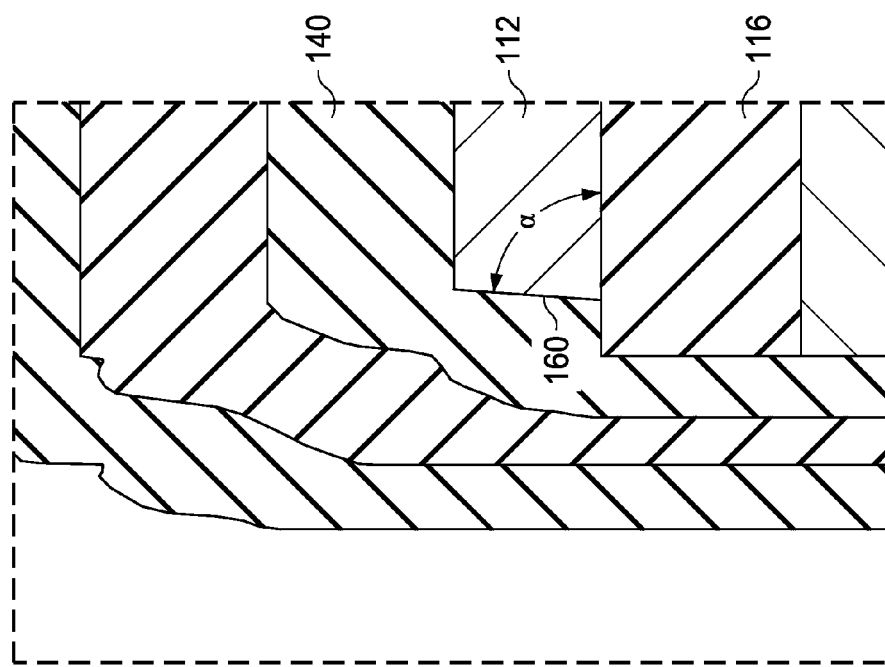
FIG. 2 is an expanded view of a molybdenum termination in the bulk acoustic wave device of FIG. 1.

The top electrode 112 terminates at a first termination 160 and a second termination 162 and the bottom electrode 114 terminates at a first termination 164 and a second termination 166. In conventional devices, the terminations 160-166 are fabricated using conventional fabrication techniques that result in steep termination angles. In addition to being generally steep, the termination angles at the terminations 160-166 cannot be maintained to be constantly fabricated within a predetermined range or below a predetermined angle. FIG. 2 is an expanded view of the termination 160 and FIG. 3 is an expanded view of the termination 162. The angle α is the termination angle at the termination 160. As shown in FIG. 2, the termination angle α is approximately seventy degrees and may range between forty and ninety degrees. Referring to FIG. 3, the termination angle β at the termination 162 is also approximately seventy degrees and may range between forty and ninety degrees. The termination angles of the terminations 164 and 166 are similar to the termination angles α and β at the terminations 160 and 162. The fabrication methods described herein reduce the termination angles α and β to less than a predetermined angle, such as thirty degrees, to prevent the formation of cracks and seams in the layers of the BAW device 100. In some embodiments, the termination angles α and β are between twelve and thirty degrees. It has been found that large termination angles in the molybdenum layers result in seams and/or cracks forming in the layers of the BAW device 100.

Reference is made to FIG. 1 to show the effects of the steep termination angles at the terminations 160-166. A crack 170 has formed from the termination 164 and extends through the AlN layer 110 and into the upper Bragg mirror 120. In addition, a seam 172 has formed above the termination 166, which is shown in the expanded view of FIG. 4. The crack 170 and the seam 172 interfere with the resonator 106 and the Bragg mirrors 120 and 122, which may change the resonance and quality of acoustic waves resonating within the resonator 106. Furthermore, the crack 170 and the seam 172 can lead to discontinuities of the top molybdenum electrode 112 between the resonator 106 and electrical contact 142. Accordingly, the crack 170 and/or the seam 172 can cause the BAW device 100 to fail depending on where the crack 170 and/or the seam 172 are located. It is noted that cracks and seams may be located proximate any of the molybdenum terminations in the BAW device 100 or on other devices where a molybdenum layer terminates at a steep angle.

The devices described herein are not as susceptible to cracking and seam formation as conventional devices because the fabrication techniques maintain the termination angles in the molybdenum layers at less than a predetermined value, which may be twelve to thirty degrees. It has been found that termination angles of thirty degrees or less at the terminations of molybdenum layers reduce the likelihood that cracks and seams will occur in stacks. Conventional molybdenum layer terminations are fabricated using metal dry or wet etch processes, which cause terminations that have steep angles, such as greater than seventy degrees. Some processes use a slope metal wet etch technique, but the technique produces inconsistent termination angles that could be greater than thirty degrees. The processes described herein result in termination angles in molybdenum layers that are consistently less than thirty degrees.

Figure 5:
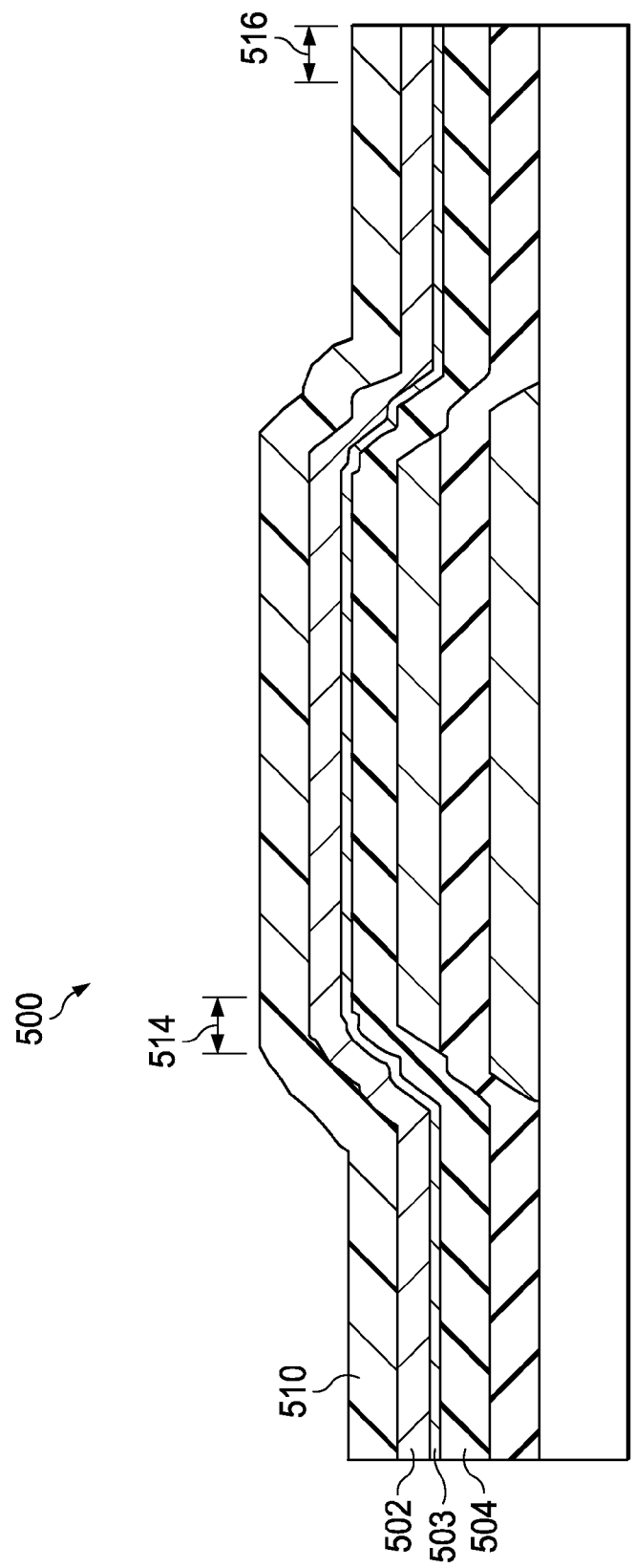
FIG. 5 is a side cutaway view of a bulk acoustic wave device of FIG. 1 in the process of being fabricated.

FIG. 5 is a side view of a device 500 in the process of being fabricated. The fabrication process described herein primarily pertains to fabrication of molybdenum layers, so the process commences with a molybdenum layer 502 fabricated onto an oxide layer 504. In some embodiments, the molybdenum layer 502 is fabricated onto a very thin aluminum nitride seed layer 503 that may extend so as to cover the oxide layer 504. With regard to the BAW device 100 of FIG. 1, the molybdenum layer 502 corresponds to the bottom electrode 114 and the oxide layer 504 corresponds to the first oxide layer 130. The thickness of the molybdenum layer 502 varies depending on the type of device in which the molybdenum layer 502 is located. In some examples, the molybdenum layer 502 is approximately 400 nm.

Figure 6:
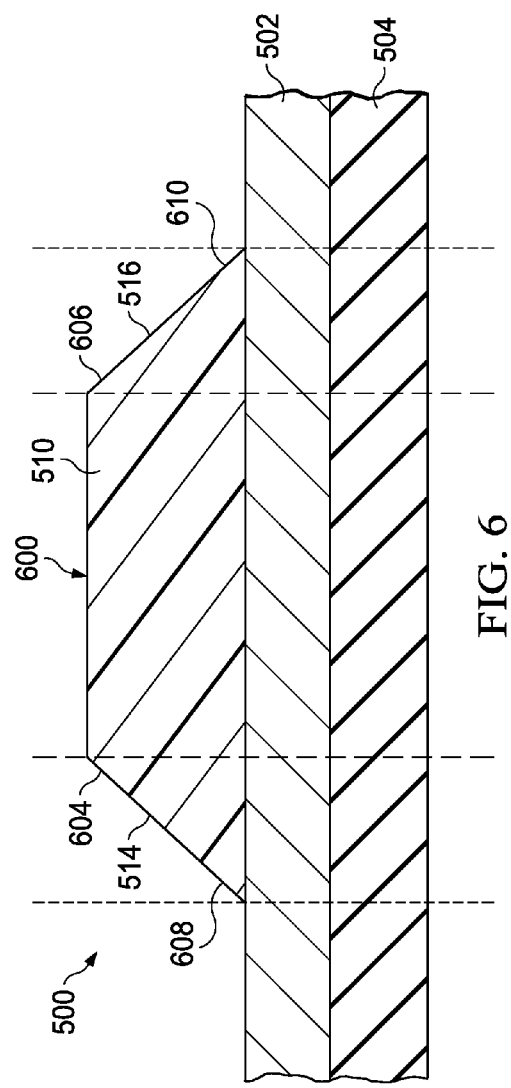
FIG. 6 is a side cutaway view of the device of FIG. 5 after the application of a photolithography step and removal of residual portions of resist material.

A photo resist layer 510 is fabricated onto the molybdenum layer 502. The etch process etches the photo resist layer 510 faster than the molybdenum layer 502. For example, the photo resist layer 510 may etch about four times faster than the molybdenum layer 502 when both are exposed to an etching material as described below. A photolithography step is performed on the device 500 wherein the photo resist layer 510 is exposed under defocus conditions to produce resist slope edges 514 and 516. In some embodiments, the defocus is approximately +17 um or -17 um. In other examples, the defocus is between +/-11 um and +/-22 um to achieve the desired termination angle in the finished molybdenum layer 502. Reference is made to FIG. 6, which is a view of the device 500 after the application of the photolithography step and removal of residual portions of the photo resist layer 510. The photolithography step creates a resist mask 600 from the photo resist layer 510, wherein portions of molybdenum layer 502 covered by the resist mask 600 will not be etched or will be etched proportional to the thickness of the resist mask 600 covering the molybdenum layer 502 during a subsequent etching step.

The photo resist layer 510 shown in FIG. 6 has been processed during the photolithography step to remove residual photo resist material in the photo resist layer 510 that was not exposed. The resulting photo resist layer 510 is the resist mask 600. As shown in FIG. 6, the resist mask 600 has sloped edges 514 and 516 that are located above the portions of the molybdenum layer 502 that will become sloped terminations. The defocus in the photolithography applied to the photo resist layer 510 establishes the slopes of the sloped edges 514 and 516, which determines termination angles in the final molybdenum layer 502 as described above. In conventional fabrication techniques, the resist is exposed at best focus conditions to provide an approximately vertical resist sidewall profile.

The defocus in the photolithography step generated the slope edges 514 and 516. The etching materials that etch the molybdenum layer 502 consume some of the resist mask 600 during the etching process. However, the slope edges 514 and 516 of the resist mask 600 are thinner than the other portions of the resist mask 600 and are less resistant to the etching materials, so they are consumed faster. Additional reference is made to FIG. 7, which is a view of the device 500 of FIG. 6 after etching. The thicker inner portions 604 and 606 of the slope edges 514 and 516 are consumed slower than the thinner outer edges 608 and 610 of the slope edges 514 and 516. The result is etching of the molybdenum layer 502 proximate the outer portions 608 and 610 of the slope edges 514 and 516 being etched more than the inner portions 604 and 606, which results in the terminations 700 and 702 of the molybdenum layer 502 having the desired termination angles 710 and 712. In some embodiments, a defocus of positive or negative 17 um on a 3.5 um photo resist layer 510 generated twenty-eight degree termination angles. In some embodiments, the angles 710 and 712 are less than thirty degrees, which reduces the likelihood of cracks and seams being created in the device in which the molybdenum layer 502 is located.

In some embodiments, the etching of the device 500 includes placing the device 500 with the resist mask 600 fabricated thereon into a plasma etch chamber where portions of the molybdenum layer 502 not masked by the resist mask 600 are etched. As described above, the portion of the molybdenum layer 502 covered by the resist mask 600 will not be fully etched. However, the slope edges 514 and 516 will be partially etched as described above to yield the predetermined termination angles 710 and 712. In some embodiments, the etching process is performed with a flowing gas mixture containing chlorine gas and oxygen gas into an etching chamber. It has been found that a 4:1 ratio of oxygen gas to chlorine gas further enables above-described termination angles 712 and 714 to be formed into the molybdenum layer 502. More specifically, the chlorine and oxygen mixture etches the photo resist layer 510 so that the termination angles 710 and 712 are formed proximate the slope edges 514 and 516. In some embodiments, the oxygen to chlorine gas ratio is between 3:1 and 5:1. This process has been found to offer high etch selectivity of molybdenum to aluminum nitride or oxide at greater than 100:1. The process also yields substantially straight terminations 700 and 702 rather than curved terminations.

The etching may further use a low transformer coupled plasma (TCP RF) at approximately 300W. In some embodiments, the power is between 275W and 400W. A bias RF having a peak voltage of approximately −150V, or a peak voltage of between −125 and −175V may be applied to the device 500 during etching. The combination of the defocus, gas ratio, and the RF enables the molybdenum layer 502 to have the termination angles 710 and 712 of thirty degrees or less consistently.

At the gas ratio and/or RF power described above, the etch step terminates by an endpoint. A timed overetch step may be followed using the same processes that clean molybdenum residues. After the molybdenum layer 502 is etched, the device 500 may be placed into a plasma ash chamber where an ashing process is applied to the resist mask 600 using the chamber. In some processes, the device 500 is heated to a temperature of about 175° C. to perform a plasma ash process with flowing oxygen gas into the ash chamber. The ash is controlled and the process is followed by a timed over-ash to remove any photo resist residues.

Figure 7:
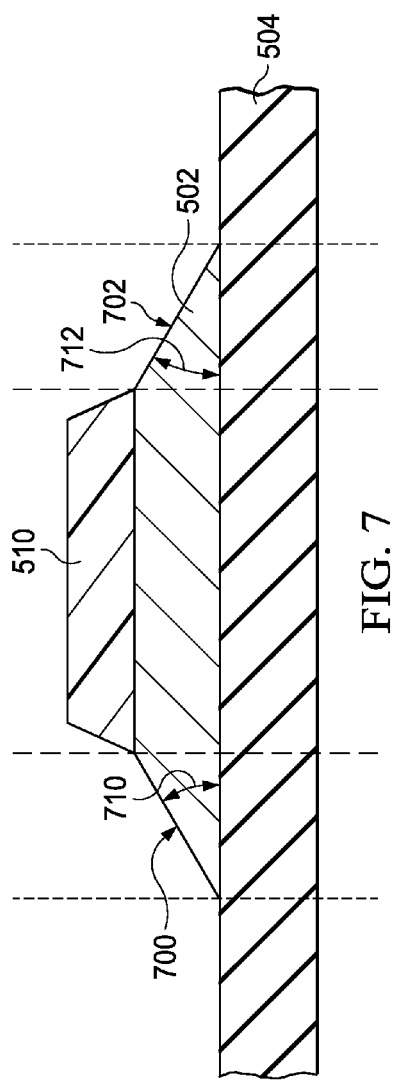
FIG. 7 is a side cutaway view of the device of FIG. 6 after etching.

The resulting termination angles 710 and 712 are illustrated in FIG. 7. The termination angle 710 in FIG. 7 corresponds to the angle α from FIG. 2 and the angle 712 corresponds to the angle β of FIG. 3. The termination angles 710 and 712 are within a predetermined value, which in the examples described herein is less than thirty degrees. The low termination angles 710 and 712 prevent the above-described cracks and seams from forming proximate the terminations 700 and 702. All of the molybdenum layers in the device 500 may be fabricated as described above to prevent the above-described steep termination angles.

Different variations of the above described methods may be implemented in the fabrication processes. For example, the photo resist material 510 may be between 3.5 um and 5.5 um. With the photo resist material 510 being 5.5 um and the defocus at +/−17 um, the termination angle 710 and 712 may be approximately 11 degrees. The etching material may have a high selectivity, such as molybdenum to aluminum nitride selectivity of greater than 100:1 and molybdenum to oxide selectivity of greater than 100:1. In some embodiments, the termination angles 710 and 712 are maintained within one percent across the device on which the molybdenum layer 502 is located.

Figure 8:
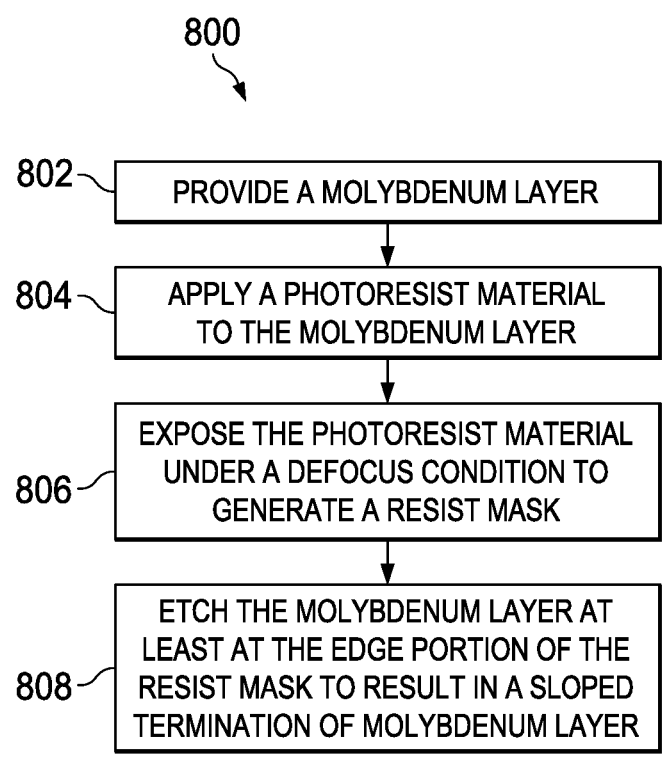
FIG. 8 is a flowchart illustrating an embodiment of a method for fabricating sloped terminations in molybdenum layers.

An embodiment of the fabrication processes described above is illustrated in the flow chart 800 of FIG. 8. The process commences at step 802 with providing a molybdenum layer. Referring to FIG. 5, the provided molybdenum layer may be the molybdenum layer 502 that is fabricated onto the oxide layer 504 or a seed layer (not shown) that is fabricated onto the oxide layer 504. At step 804, a photo resist material is applied to the molybdenum layer. The photo resist material may be the photo resist layer 510 described with reference to FIG. 5. In step 806, the photo resist material is exposed under a defocus condition to generate a resist mask having an edge portion. The resist mask may correspond to the mask 600 and an edge of the exposed photo resist material may correspond to one of either of the slope edges 514 or 516. In step 808, the molybdenum layer is etched at the edge portion of the resist mask to result in a sloped termination of the molybdenum layer.

While some examples of fabrication methods have been described in detail herein, it is to be understood that the inventive concepts may be otherwise variously embodied and employed and that the appended claims are intended to be construed to include such variations except insofar as limited by the prior art.

What is claimed is:

1. A method of fabricating a sloped termination of a molybdenum layer, the method comprising:
    forming the molybdenum layer;
    applying a photo resist material to the molybdenum layer;
    exposing the photo resist material under a defocus condition to generate a resist mask having an edge portion, wherein the defocus condition is between +/−11um and +/−22 um;
    etching the molybdenum layer at least at the edge portion of the resist mask to result in a sloped termination of the molybdenum layer.

2. The method of claim 1, wherein forming the molybdenum layer comprises forming a molybdenum layer on an oxide layer.

3. The method of claim 1, wherein the etching comprises exposing the molybdenum layer and the photo resist material to a gas comprising chlorine and oxygen.

4. The method of claim 3, wherein the ratio of oxygen to chlorine is between 3:1 and 5:1.

5. The method of claim 3, wherein the ratio of oxygen to chlorine is approximately 4:1.

6. The method of claim 1, wherein the etching comprises applying a low transformer coupled plasma between 275 watts and 400 watts.

7. The method of claim 1, wherein the etching comprises applying a low transformer coupled plasma at approximately 300 watts.

8. The method of claim 1, wherein the etching comprises applying a bias RF of between −125 peak volts and −175 peak volts.

9. The method of claim 1, wherein the etching comprises applying a bias RF of approximately −150 volts.

10. The method of claim 1, wherein the defocus condition is approximately +/−17 um.

11. The method of claim 1, wherein the etching material has a selectivity of molybdenum to aluminum nitride that is greater than 100:1.

12. The method of claim 1, wherein the etching material has a selectivity of molybdenum to oxide that is greater than 100:1.

13. A method of fabricating a Bragg mirror having a sloped termination of a molybdenum layer, the method comprising:
    forming the molybdenum layer on a seed layer;
    applying a photo resist material to the molybdenum layer;
    exposing the photo resist material under a defocus condition to generate a resist mask, an edge of the exposed photo resist material corresponding to a region of the molybdenum layer that is to become the sloped termination, wherein the defocus condition is between +/−11 um and +/−22 um;

etching the molybdenum layer with an etching material, wherein the etching material at least partially etches the photo resist material exposed under the defocused condition, the etching resulting in the sloped termination.

14. The method of claim 13 wherein the seed layer is a seed layer for aluminum nitride.

15. The method of claim 13, wherein the seed layer is an oxide.

16. The method of claim 13, wherein the etching comprises exposing the molybdenum layer and the photo resist material to a gas comprising oxygen and chlorine gas in a ration of oxygen to chlorine between 3:1 and 5:1.

17. The method of claim 13, wherein the etching comprises applying a low transformer coupled plasma between 275 watts and 400 watts.

18. The method of claim 13, wherein the etching comprises applying a bias RF of between −125 peak volts and −175 peak volts.

19. The method of claim 13, wherein the etching material has a selectivity of molybdenum to aluminum nitride that is greater than 100:1 and a selectivity of molybdenum to oxide that is greater than 100:1.

20. A method of fabricating a sloped termination of a molybdenum layer, the method comprising:

providing the molybdenum layer;

applying a photo resist material to the molybdenum layer;

exposing the photo resist material under a defocus condition of between +/−11 um and +/−22 um to generate a resist mask, an edge of the exposed photo resist material corresponding to the sloped termination;

etching the molybdenum layer with an etching material, wherein the etching material having a selectivity of molybdenum to aluminum nitride that is greater than 100:1 and a selectivity of molybdenum to oxide that is greater than 100:1 that at least partially etches the photo resist material exposed under the defocused condition, the etching resulting in the sloped termination.

* * * * *